US012230684B2

(12) United States Patent
Park et al.

(10) Patent No.: US 12,230,684 B2
(45) Date of Patent: Feb. 18, 2025

(54) INTEGRATED CIRCUIT WITH CONTINUOUS ACTIVE REGION AND RAISED SOURCE/DRAIN REGION

(71) Applicant: SAMSUNG ELECTRONICS CO., LTD., Suwon-si (KR)

(72) Inventors: Jinha Park, Yongin-si (KR); Youngju Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 318 days.

(21) Appl. No.: 17/862,596

(22) Filed: Jul. 12, 2022

(65) Prior Publication Data

US 2023/0027769 A1 Jan. 26, 2023

(30) Foreign Application Priority Data

Jul. 26, 2021 (KR) ........................ 10-2021-0098115
Dec. 16, 2021 (KR) ........................ 10-2021-0181032

(51) Int. Cl.

*H01L 29/417* (2006.01)
*H01L 21/84* (2006.01)
*H01L 27/02* (2006.01)
*H01L 27/12* (2006.01)
*H01L 29/08* (2006.01)

(Continued)

(52) U.S. Cl.

CPC ........ *H01L 29/41775* (2013.01); *H01L 21/84* (2013.01); *H01L 27/1203* (2013.01); *H01L 29/0847* (2013.01); *H01L 29/401* (2013.01); *H01L 29/7838* (2013.01)

(58) Field of Classification Search

CPC ....... H01L 21/823475; H01L 21/76805; H01L 21/76895; H01L 23/535; H01L 23/485; H01L 21/823481; H01L 29/0649; H01L 29/0653; H01L 29/6681; H01L 27/0207; H01L 27/11807; H01L 21/823871; H01L 21/76897; H01L 29/66515; H01L 21/823425; H01L 29/41775; H01L 29/66606; H01L 21/823437

See application file for complete search history.

(56) References Cited

U.S. PATENT DOCUMENTS 9,379,058 B2 6/2016 Song et al.
10,726,186 B2 7/2020 Kim et al.

(Continued)

FOREIGN PATENT DOCUMENTS

JP 2011-146478 A 7/2011

*Primary Examiner* — Sonya McCall-Shepard
(74) *Attorney, Agent, or Firm* — Sughrue Mion, PLLC

(57) ABSTRACT

According to example embodiments, an integrated circuit includes a continuous active region extending in a first direction, a tie gate electrode extending in a second direction crossing the first direction on the continuous active region, a source/drain region provided adjacent the tie gate electrode, a tie gate contact extending in a third direction perpendicular to the first direction and the second direction on the continuous active region and connected to the tie gate electrode, a source/drain contact extending in the third direction and connected to the source/drain region, and a wiring pattern connected to each of the tie gate contact and the source/drain contact and extending in a horizontal direction. A positive supply power is applied to the wiring pattern.

20 Claims, 16 Drawing Sheets

First active region
Second active region
M1
First contact
Second contact
Active Gate Electrode
Dummy Gate Electrode

100

1D 1E 1F
CD1 CD2
VDD
1A 1A'
1B 1B'
RX1
AG1
TG1 AG2 AG3 TG2 AG4 FR
RX2
1C 1C'
VSS
CPP
W1 W2
1D' 1E' 1F'
Y
X
Z

(51) Int. Cl.

| | |
|---|---|
| ***H01L 29/40*** | (2006.01) |
| ***H01L 29/66*** | (2006.01) |
| ***H01L 29/78*** | (2006.01) |
| ***H01L 29/786*** | (2006.01) |
| ***H10B 12/00*** | (2023.01) |
| ***H10B 41/40*** | (2023.01) |

(56) References Cited

U.S. PATENT DOCUMENTS

| | | | | |
|---|---|---|---|---|
| 10,878,161 | B2 | 12/2020 | Peng et al. | |
| 10,943,923 | B2 | 3/2021 | Jeong et al. | |
| 2015/0311122 | A1* | 10/2015 | Rashed | H01L 21/823475 438/283 |
| 2016/0133623 | A1* | 5/2016 | Xie | H01L 29/66545 438/586 |
| 2016/0336183 | A1* | 11/2016 | Yuan | H01L 27/0886 |
| 2017/0358565 | A1 | 12/2017 | Hensel et al. | |
| 2018/0061943 | A1* | 3/2018 | Choi | H01L 29/78 |
| 2021/0057310 | A1 | 2/2021 | Do et al. | |
| 2021/0082903 | A1 | 3/2021 | Young et al. | |

* cited by examiner

INTEGRATED CIRCUIT WITH CONTINUOUS ACTIVE REGION AND RAISED SOURCE/DRAIN REGION

CROSS-REFERENCE TO RELATED APPLICATIONS

This application is based on and claims priority under 35 U.S.C. § 119 to Korean Patent Application Nos. 10-2021-0098115, filed on Jul. 26, 2021, and 10-2021-0181032, filed on Dec. 16, 2021, in the Korean Intellectual Property Office, the disclosures of which are incorporated by reference herein in their entirety.

BACKGROUND

1. Field

Example embodiments of the present disclosure relate to an integrated circuit, and more particularly, to an integrated circuit including a continuous active region and a raised source/drain region.

2. Description of Related Art

With the recent miniaturization of semiconductor processes, the gate spacing and gate length of metal-oxide semiconductor (MOS) field-effect transistors (FETs) (MOSFETs) constituting the circuit are also being miniaturized. Accordingly, in the formation of an integrated circuit, yield degradation and reliability degradation due to local layout effects or layout-dependent effects are becoming increasingly serious.

Local layout effects are environmental effects that negatively affect electrical characteristics of a semiconductor device due to a physical layout and proximity to other features of an integrated circuit. One scheme to mitigate the local layout effect is to provide an isolation gate electrode configured in a gate tie-down manner.

SUMMARY

Provided is an integrated circuit with improved reliability.

Additional aspects will be set forth in part in the description which follows and, in part, will be apparent from the description, or may be learned by practice of the presented embodiments.

According to an aspect an example embodiment, an integrated circuit may include a first active region extending in a first direction, a second active region provided along the first direction, a first active gate electrode, a second active gate electrode, a third active gate electrode and a fourth active gate electrode each extending in a second direction intersecting the first direction on the first active region and the second active regions, where the first active gate electrode, the second active gate electrode, the third active gate electrode and the fourth active gate electrode are spaced apart from each other in the first direction, a first tie gate electrode provided between the first active gate electrode and the second active gate electrode and extending in the second direction, a second tie gate electrode provided between the third active gate electrode and the fourth active gate electrode and extending in the second direction, a first source/drain region on the first active region, where the first source/drain region is provided between the first tie gate electrode and the second active gate electrode, a second source/drain region on the first active region, where the second source/drain region is provided between the third active gate electrode and the second tie gate electrode, a first tie gate contact extending in a third direction perpendicular to the first direction and the second direction and connected to the first tie gate electrode, a second tie gate contact extending in the third direction and connected to the second tie gate electrode, a first source/drain contact extending in the third direction and connected to the second source/drain region, and a second source/drain contact extending in the third direction and connected to the first source/drain region. The first tie gate contact may be configured to be shorted to the second source/drain contact and the second tie gate contact may be configured to be shorted to the first source/drain contact.

According to an aspect of an example embodiment, an integrated circuit may include includes a continuous active region extending in a first direction, a tie gate electrode extending in a second direction crossing the first direction on the continuous active region, a source/drain region provided adjacent the tie gate electrode, a tie gate contact extending in a third direction perpendicular to the first direction and the second direction on the continuous active region and connected to the tie gate electrode, a source/drain contact extending in the third direction and connected to the source/drain region, and a wiring pattern connected to each of the tie gate contact and the source/drain contact and extending in a horizontal direction. A positive supply power may be applied to the wiring pattern.

According to an aspect of an example embodiment, an integrated circuit may include an active region extending in a first direction, a first active gate electrode extending in a second direction crossing the first direction on the active region, a second active gate electrode extending in the second direction on the active region and spaced apart from the first active gate electrode in the first direction, a tie gate electrode provided between the first active gate electrode and the second active gate electrode and extending in the second direction, a source/drain region provided between the tie gate electrode and the second active gate electrode, a tie gate contact extending in a third direction perpendicular to the first direction and the second direction on the active region and connected to the tie gate electrode, and a source/drain contact extending in the third direction and connected to the source/drain region. The tie gate contact may be configured to be shorted to the source/drain contact, and a distance between the tie gate contact and the source/drain contact may be about 0.35 times to about 0.7 times a gate pitch that is an arrangement interval in the first direction between the first active gate electrode and the second active gate electrode, and the tie gate electrode.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS

Figure 1:
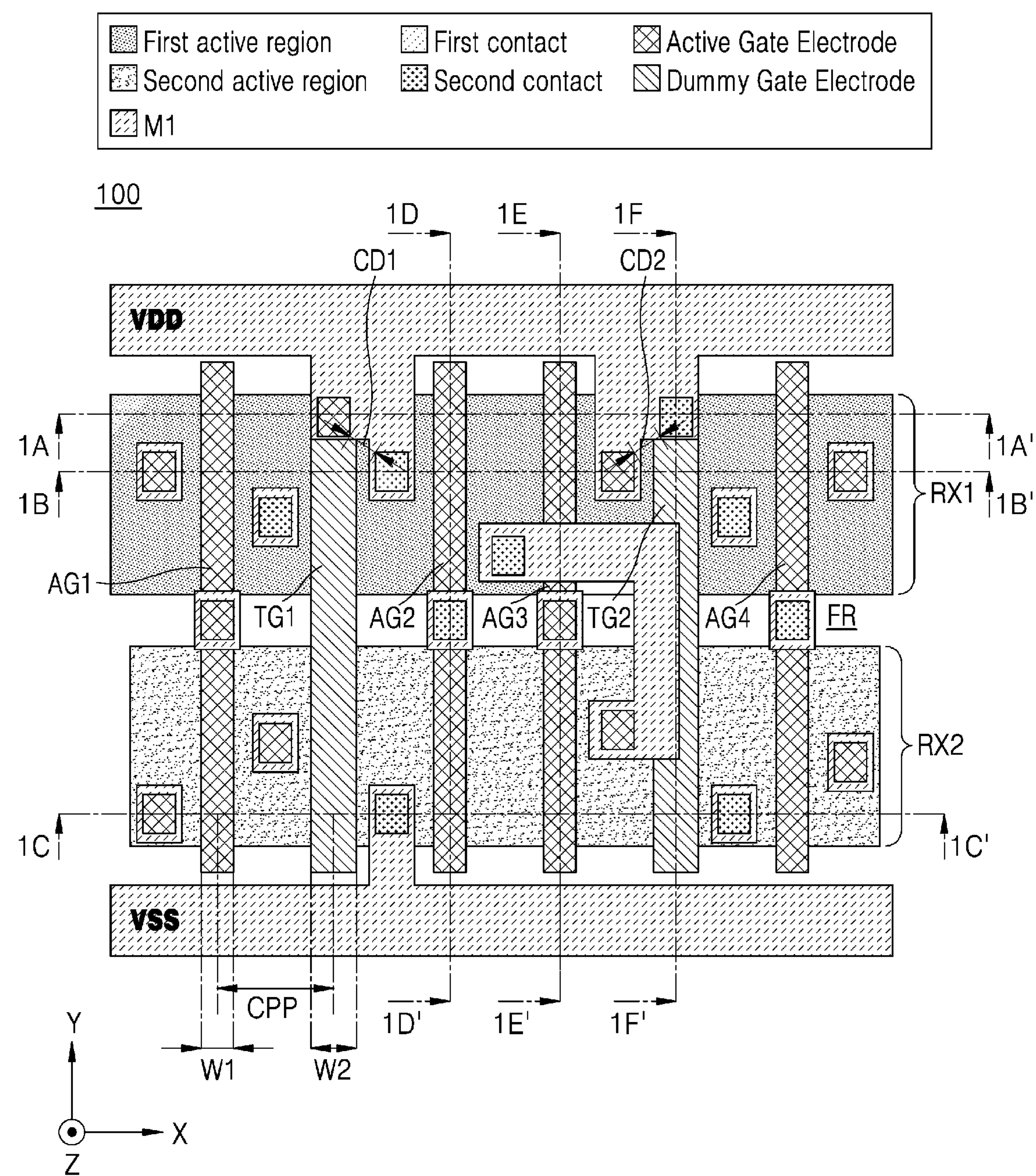
FIG. 1 is a diagram illustrating an integrated circuit according to example embodiments.

Hereinafter, example embodiments of the disclosure will be described in detail with reference to the accompanying drawings. The embodiments described herein are example embodiments, and thus, the inventive concept is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. The same reference numerals are used for the same components in the drawings, and duplicate descriptions thereof are omitted.

FIG. 1 is a diagram illustrating an integrated circuit 100 according to example embodiments.

More specifically, FIG. 1 shows a portion of an integrated circuit 100. A region shown in FIG. 1 may be designed to perform a predefined function, and may be referred to as a standard cell. The integrated circuit 100 may include a plurality of cells having various functions, and the plurality of cells may be arranged in a plurality of rows.

According to example embodiments, the integrated circuit 100 may be a logic circuit of any one of dynamic random access memory (DRAM) and NAND flash memory, and may be configured to control a memory cell included in the DRAM and NAND flash memory.

Hereinafter, a plane consisting of the X and Y axes may be referred to as a horizontal plane, and a component disposed in the +Z direction relative to other components may be referred to as being above other components, and a component disposed in the –Z direction relative to other components may be referred to as being under the other component. In addition, the area of the component may refer to the size occupied by the component in a plane parallel to the horizontal plane, and the height of the component may refer to the length of the component in the Y-axis direction. In the drawings of the present specification, only some layers may be shown for convenience of illustration, and contacts may be displayed even though they are located under the pattern of the wiring layer to indicate a connection between the wiring pattern and the sub-pattern of the wiring layer.

At the boundary of the row, wiring patterns P1 and P5 (refer to FIG. 2D) (hereinafter may be referred to as power lines) to which a positive supply voltage VDD and a negative supply voltage VSS (or ground potential) are respectively applied may extend in the X direction, and a first active region RX1 in which a P-type Metal-Oxide-Semiconductor Field Effect Transistor (MOSFET) is formed and a second active region RX2 in which the N-type MOSFET is formed may extend in the X direction.

A portion on which the deep trench insulating film 20 (refer to FIG. 2D) is disposed may be a field region FR. The deep trench insulating film 20 (refer to FIG. 2D) defines the first active region RX1 and the second active regions RX2 by separating the first active region RX1 and the second active regions RX2. The first active region RX1 and the second active regions RX2 may be spaced apart from each other with the field region FR arranged therebetween. Also, the deep trench insulating film 20 (refer to FIG. 2D) may be disposed under the power lines to overlap the power lines in the Z direction. Accordingly, along the Y direction, a field region FR, a first active region RX1, a field region FR, a second active region RX2, and a field region FR may be sequentially disposed.

The first active region RX1 may be a continuous active region, and the second active regions RX2 may be a discontinuous active region. According to example embodiments, one cell of the integrated circuit 100 may include only one continuous first active region RX1 and may include a plurality of second active regions RX2.

In this example, the integrated circuit 100 may include first to fourth active gate electrodes AG1, AG2, AG3, and AG4 and first and second tie gate electrodes TG1 and TG2. In example embodiments, the first to fourth active gate electrodes AG1, AG2, AG3, and AG4 may be gates for performing a control function of the integrated circuit 100, and the first and second tie gate electrodes TG1 and TG2 may electrically isolate the adjacent active gate electrodes AG1, AG2, AG3 and AG4.

For example, the first tie gate electrode TG1 may be arranged between the first and second active gate electrodes AG1 and AG2, and may electrically isolate the first and second active gate electrodes AG1 and AG2 from each other. The second tie gate electrode TG2 may be arranged between the third and fourth active gate electrodes AG3 and AG4, and may electrically isolate the third and fourth active gate electrodes AG3 and AG4 from each other. Due to the electrical isolation operation of the first and second tie gate electrodes TG1 and TG2, the first active region RX1 may be provided as a continuous active region, and enhance the operational performance of the integrated circuit 100.

The first and second active regions RX1 and RX2 may cross the first to fourth active gate electrodes AG1, AG2, AG3, and AG4 to form a transistor. According to example embodiments, a P-type MOSFET may be disposed in the first active region RX1, and an N-type MOSFET may be disposed in the second active region RX2. The P-type MOSFET and the N-type MOSFET may constitute a complementary MOSFET (CMOSFET). The combination of the CMOSFETs may constitute a logic circuit for performing a predefined function.

Figure 2A:
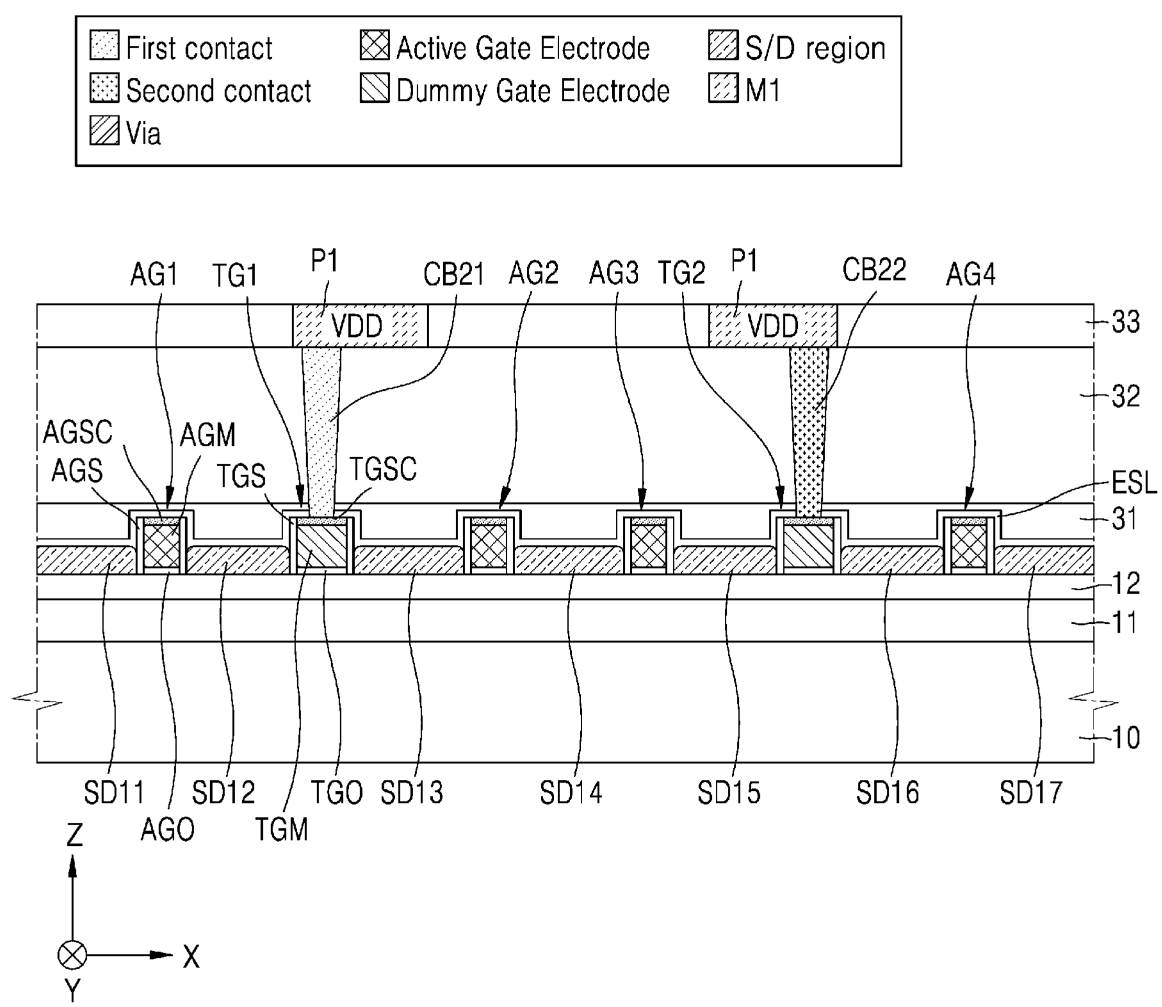
FIG. 2A is a cross-sectional view taken along the cut line 1A-1A' of FIG. 1 according to example embodiments.
Figure 2B:
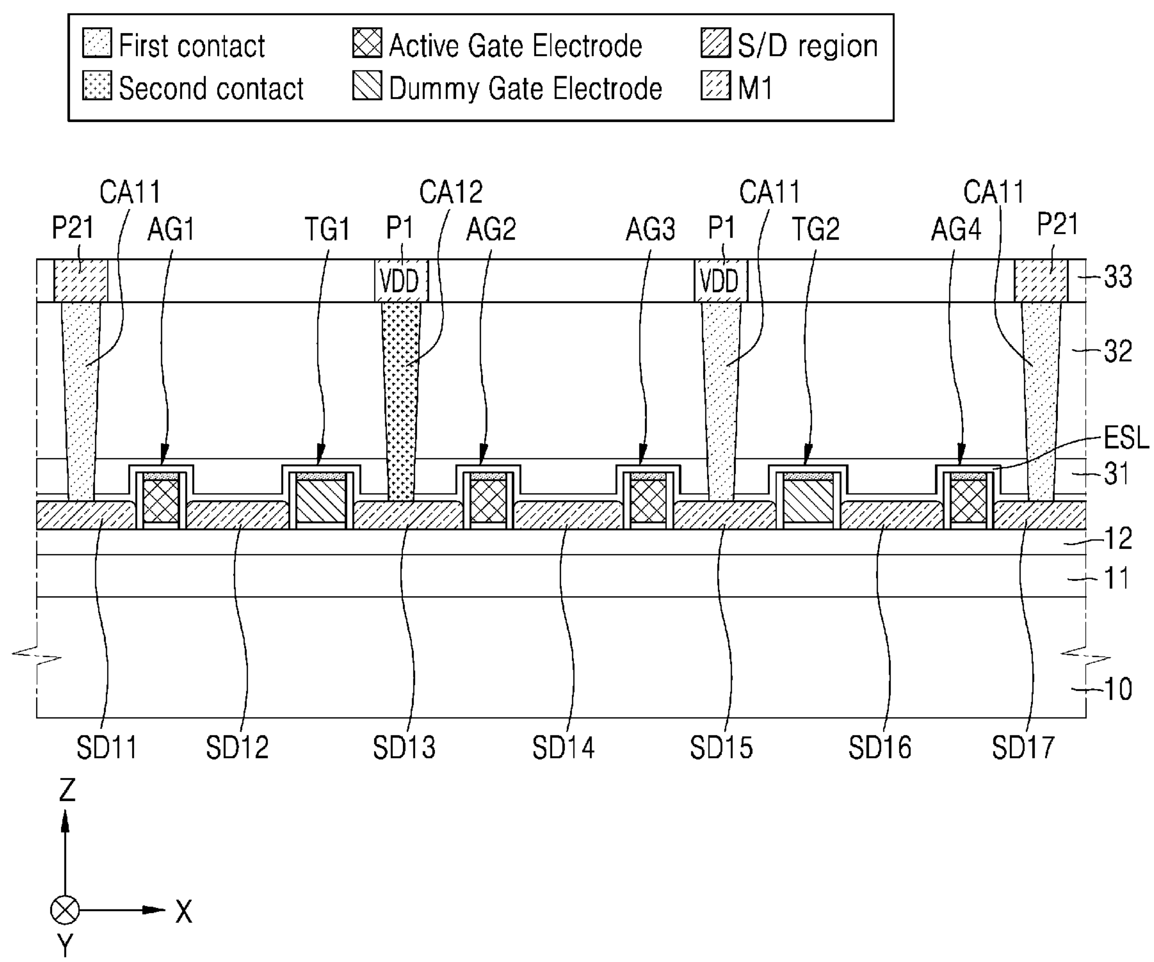
FIG. 2B is a cross-sectional view taken along the cut line 1B-1B' of FIG. 1 according to example embodiments.

The first and second tie gate electrodes TG1 and TG2 may be configured to be electrically connected to the corresponding source/drain regions SD13 and SD15 (refer to FIG. 2B). The tie gate electrodes TG1 and TG2 may be shorted to neighboring source/drain regions SD13 and SD15 (refer to FIG. 2B). A positive supply voltage VDD may be applied to the first and second tie gate electrodes TG1 and TG2 and the source/drain regions SD13 and SD15 (refer to FIG. 2B). This connection method is referred to as a gate tie-down.

According to example embodiments, the tie gate electrodes TG1 and TG2 and the source/drain regions SD13 and SD15 (refer to FIG. 2B) may receive a positive supply voltage VDD from the same wiring pattern P1 (refer to FIG. 1) of the first wiring layer M1. In example embodiments, the tie gate electrodes TG1 may be shorted to the source/drain regions SD13 and SD15 (refer to FIG. 2B) through the first wiring layer M1.

Figure 2C:
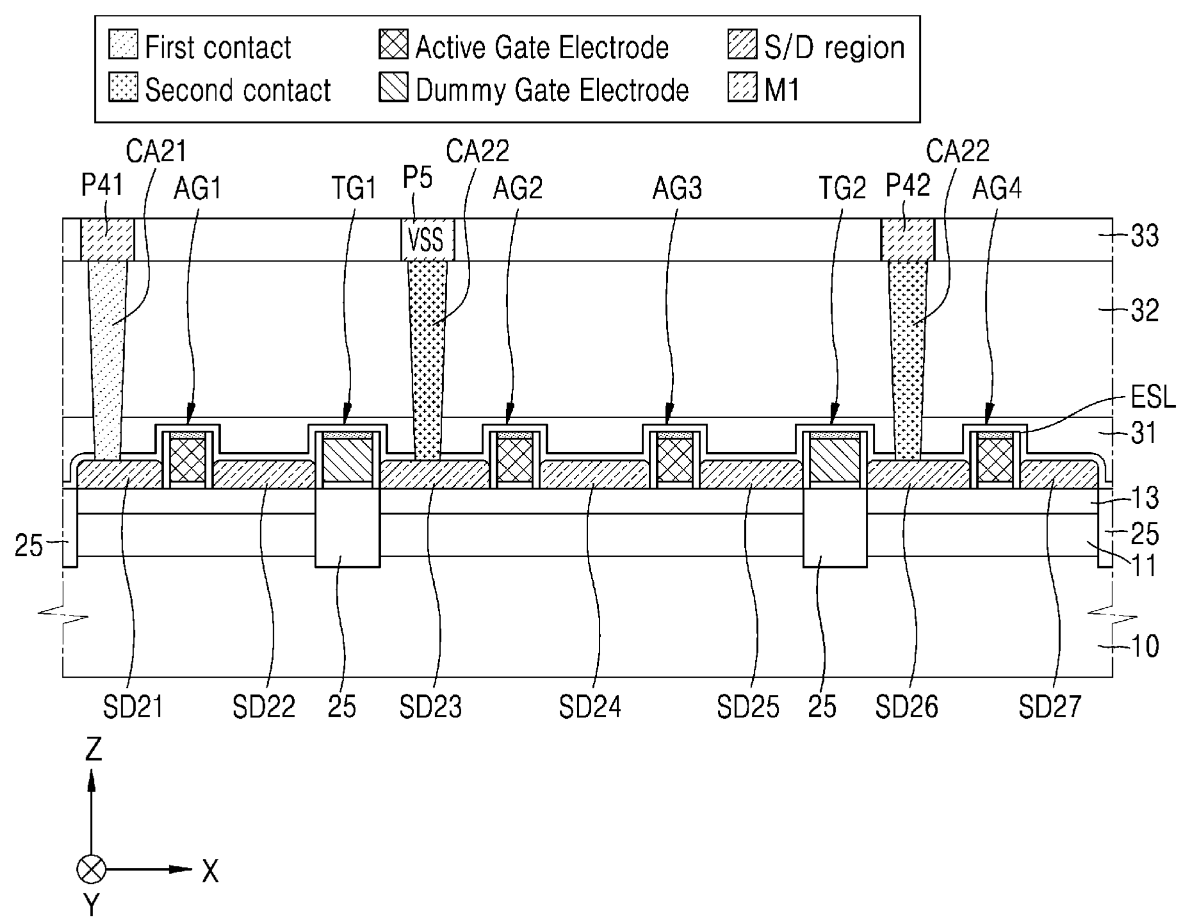
FIG. 2C is a cross-sectional view taken along the cut line 1C-1C' of FIG. 1 according to example embodiments.
Figure 2D:
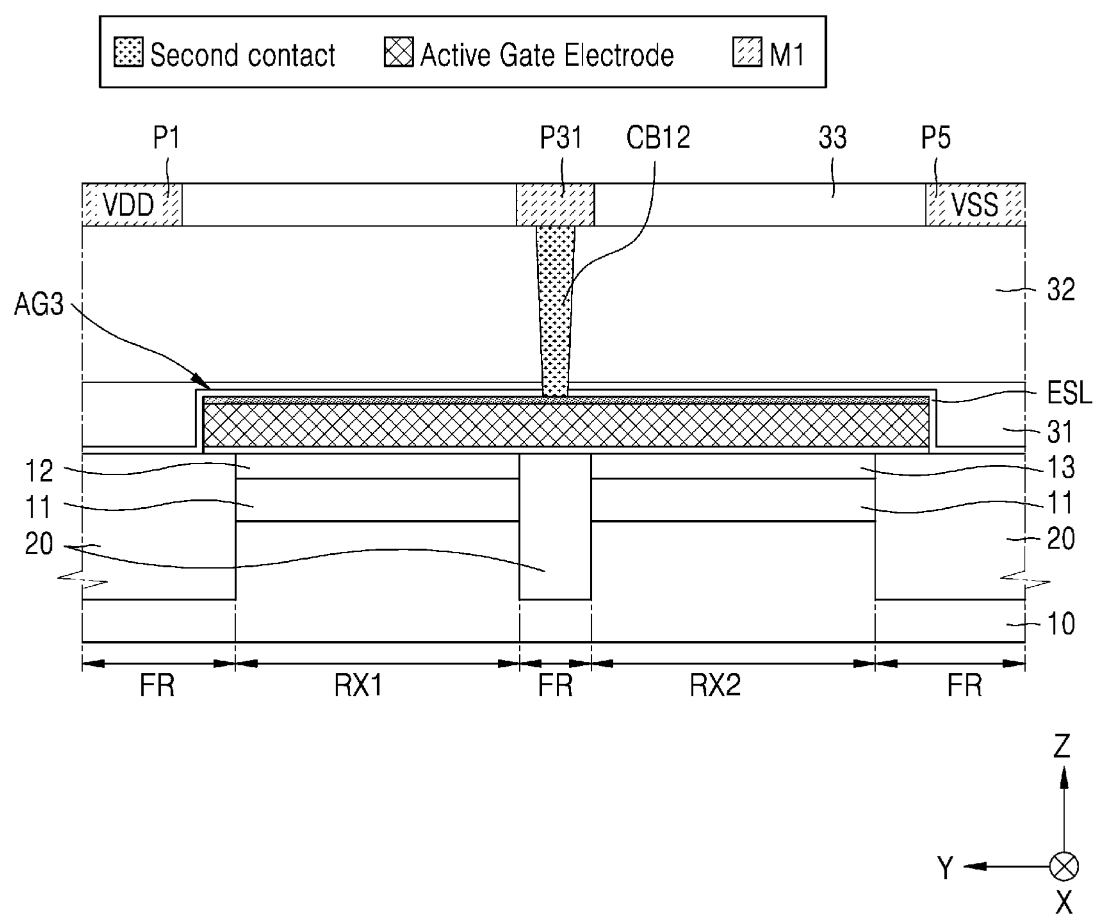
FIG. 2D is a cross-sectional view taken along the cut line 1D-1D' of FIG. 1 according to example embodiments.
Figure 2E:
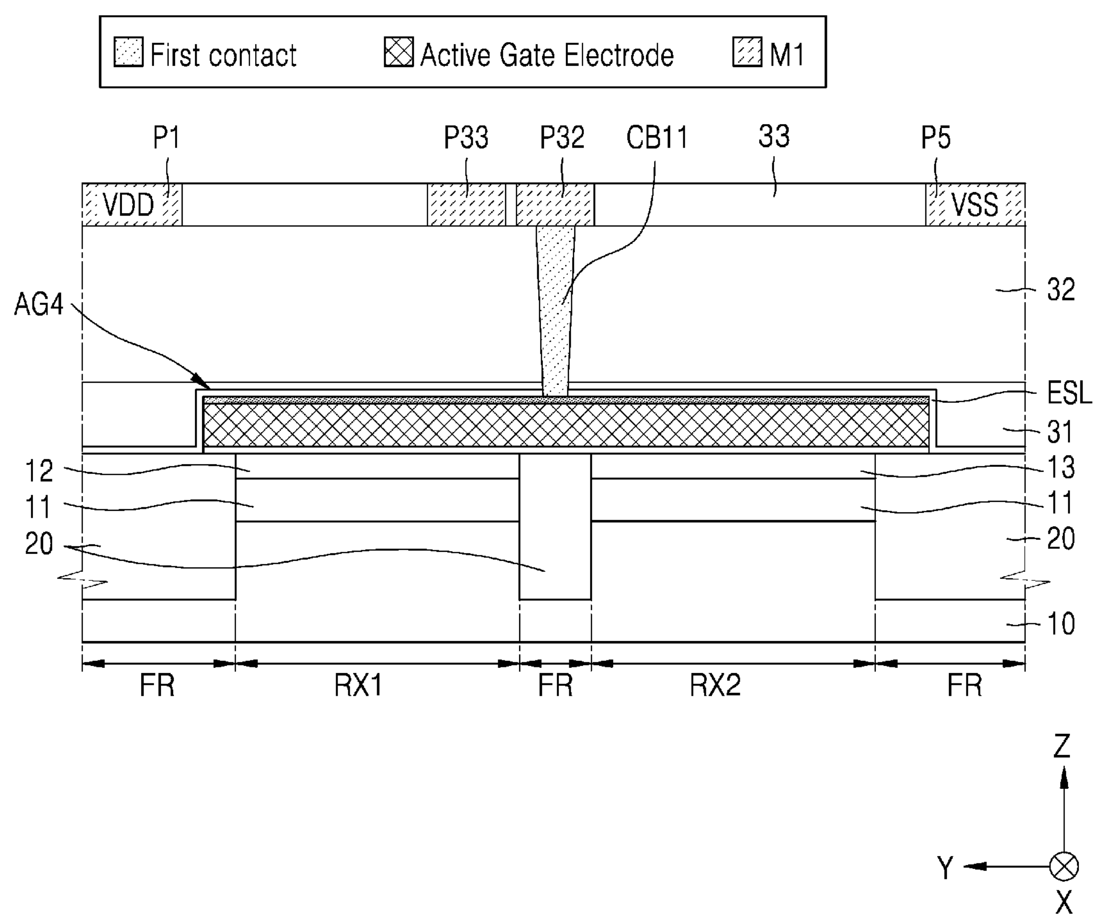
FIG. 2E is a cross-sectional view taken along the cut line 1E–1E' of FIG. 1 according to example embodiments.
Figure 2F:
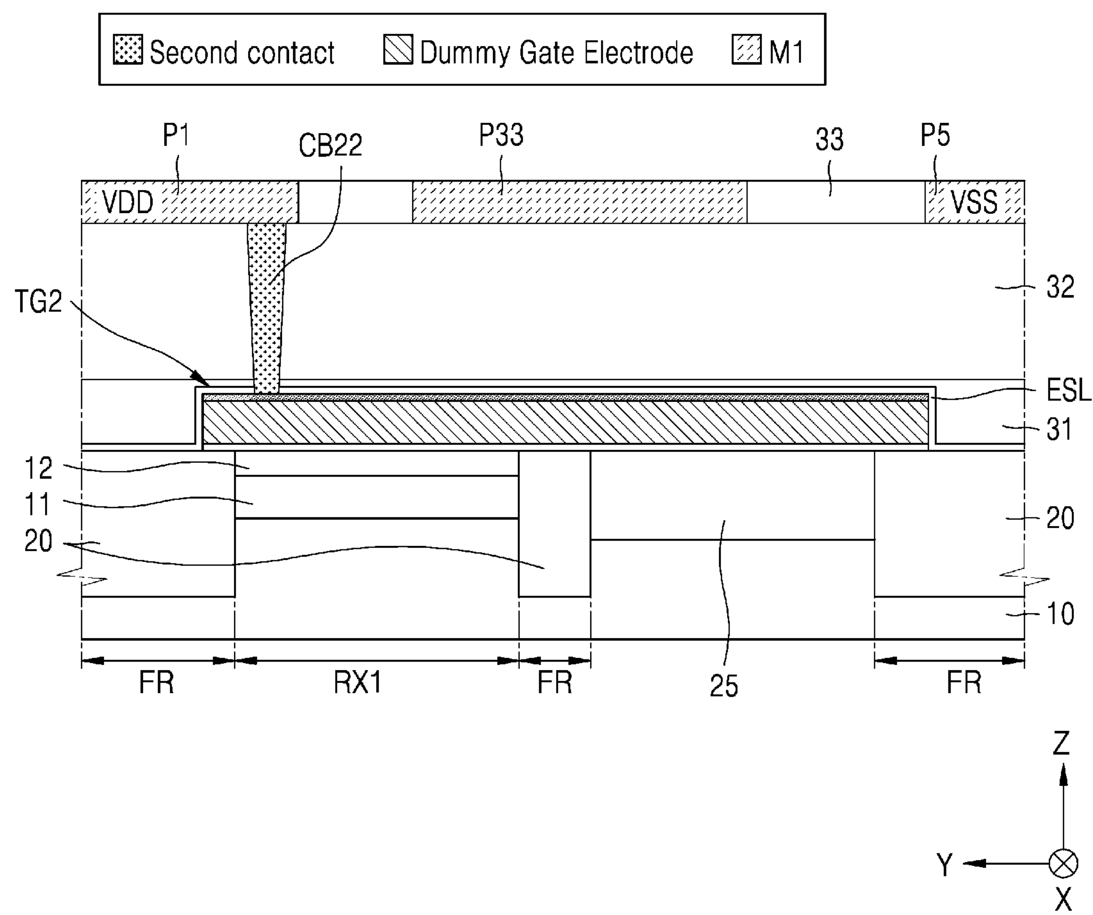
FIG. 2F is a cross-sectional view taken along the cut line 1F-1F' of FIG. 1 according to example embodiments.

FIGS. 2A to 2F are cross-sectional views illustrating examples of a structure of a cell according to example embodiments of the present disclosure. Specifically, FIG. 2A is a cross-sectional view taken along the cut line 1A-1A' of FIG. 1, FIG. 2B is a cross-sectional view taken along the cut line 1B-1B' of FIG. 1, FIG. 2C is a cross-sectional view taken along the cut line 1C-1C' of FIG. 1, FIG. 2D is a cross-sectional view taken along the cut line 1D-1D' of FIG. 1, FIG. 2E is a cross-sectional view taken along the cut line 1E-1E' of FIG. 1, and FIG. 2F is a cross-sectional view taken along the cut line 1F-1F' of FIG. 1.

Although not shown in FIGS. 2A to 2F, barrier films may be further provided on side surfaces and lower surfaces of the contacts.

Referring to FIGS. 1 and 2A, the integrated circuit 100 may include a fully depleted silicon on insulator (FDSOI) structure. The integrated circuit 100 may include a substrate 10, a buried oxide layer 11 disposed on the substrate 10, and a channel layer 12 disposed on the buried oxide layer 11.

According to example embodiments, the substrate 10 may be bulk silicon. As a non-limiting example, the substrate 10 may include SiGe, InSb, a PbTe compound, InAs, phosphide, GaAs, or GaSb.

The buried oxide layer 11 may cover the upper surface of the substrate 10. The buried oxide layer 11 may include, for example, silicon oxide. According to example embodiments, the buried oxide layer 11 formed on the substrate 10 may be provided by a Silicon On Sapphire (SOS) process for growing a hetero epitaxial silicon layer on a sapphire substrate, a Separation by Implanted Oxygen (SIMOX) process in which oxygen ions are implanted into a silicon substrate and then annealed to form a buried silicon oxide layer, a bonding SOI process for bonding at least one wafer on which an insulating film is formed on the surface and another wafer, and the like.

The channel layer 12 may include, for example, a semiconductor material. According to example embodiments, the channel layer 12 may be a silicon layer or a silicon germanium layer provided by an epitaxial growth process or the like.

According to example embodiments, the channel layer 12 may be doped to have a conductivity type different from that of the source/drain regions SD11, SD12, SD13, SD14, SD15, SD16, and SD17 (hereinafter SD11 to SD17). For example, when the source/drain regions SD11 to SD17 are doped with P-type dopants, the channel layer 12 may be doped with N-type dopants.

In example embodiments, the first to fourth active gate electrodes AG1, AG2, AG3, and AG4, the first and second tie gate electrodes TG1 and TG2, and the source/drain regions SD11 to SD17 may be disposed on the channel layer 12 of the first active region RX1.

The source/drain regions SD11 to SD17 may be provided by, for example, in-situ doped raised source and drain (RSD) epitaxial growth. Upper surfaces of the source/drain regions SD11 to SD17 may be at a higher level than the upper surfaces of the channel layer 12. Accordingly, a short channel effect may be prevented, and contacts to the source/drain regions SD11 to SD17 may be easily provided.

Each of the first to fourth active gate electrodes AG1, AG2, AG3, and AG4 may include an active gate dielectric layer AGO, an active gate conductive layer AGM, an active gate spacer AGS, and an active gate silicide layer AGSC.

Each of the first and second tie gate electrodes TG1 and TG2 may include a tie gate dielectric layer TGO, a tie gate conductive layer TGM, a tie gate spacer TGS, and a tie gate silicide layer TGSC.

In example embodiments, the active gate dielectric layer AGO and the tie gate dielectric layer TGO may include a high-k material. In example embodiments, the active gate dielectric layer AGO and the tie gate dielectric layer TGO may include any one of zirconium oxide, hafnium oxide, and titanium oxide.

In example embodiments, the active gate conductive layer AGM and the tie gate conductive layer TGM may include a metal material. For example, the active gate conductive layer AGM and the tie gate conductive layer TGM may include Ti, Ta, W, Al, Co, or a combination thereof. In another example, the active gate conductive layer AGM and the tie gate conductive layer TGM may include a semiconductor material such as Si or SiGe. In another example, the active gate conductive layer AGM and the tie gate conductive layer TGM may include a multilayer structure in which two or more conductive materials are stacked. For example, the active gate conductive layer AGM and the tie gate conductive layer TGM may have a conformal deposition structure of a work function control film including any one of TiN, TaN, TiC, TaC, TiAlC, and combinations thereof, and may include a filling conductive film filling the inside of the conformal deposition structure of the work function control film and including W, Al, or the like.

In example embodiments, the active gate spacer AGS and the tie gate spacer TGS may include an insulating material. The active gate spacer AGS and the tie gate spacer TGS may include, for example, silicon nitride such as $Si_3N_4$. The active gate spacer AGS and the tie gate spacer TGS may prevent an unwanted short circuit between the first to fourth active gate electrodes AG1, AG2, AG3, and AG4 and the first and second tie gate electrodes TG1 and TG2 and wirings. The active gate spacer AGS and the tie gate spacer TGS may prevent diffusion of material to and/or from the active gate conductive layer AGM and the tie gate conductive layer TGM.

The active gate silicide layer AGSC and the tie gate silicide layer TGSC may include a metal silicide material. The active gate silicide layer AGSC and the tie gate silicide layer TGSC may reduce contact resistance between the first and second tie gate contacts CB21 and CB22 and the first and second tie gate electrodes TG1 and TG2 and contact resistance between the first and second active gate contacts CB11 and CB12 (refer to FIG. 2B) and the first to fourth active gate electrodes AG1, AG2, AG3, and AG4.

The source/drain regions SD11 and SD12 and the first active gate electrode AG1 may constitute a first P-type MOSFET. The source/drain regions SD13 and SD14 and the second active gate electrode AG2 may constitute a second P-type MOSFET. The source/drain regions SD14 and SD15 and the third active gate electrode AG3 may constitute a third P-type MOSFET. The source/drain regions SD16 and SD17 and the fourth active gate electrode AG4 may constitute a fourth P-type MOSFET.

As described above, the source/drain region SD13 and the first tie gate electrode TG1 may be connected in a gate tie-down manner to electrically isolate the first P-type MOSFET and the second P-type MOSFET. As described above, the source/drain region SD15 and the second tie gate electrode TG2 may be connected in a gate tie-down manner to electrically isolate the third P-tune MOSFET and the fourth P-tune MOSFET.

In example embodiments, the etch stop film ESL may cover the first to fourth active gate electrodes AG1, AG2, AG3, and AG4, the first and second tie gate electrodes TG1 and TG2, and the source/drain regions SD11 to SD17. In example embodiments, the etch stop film ESL may include silicon nitride. In example embodiments, the etch stop film ESL may expose upper surfaces of the first and second tie gate electrodes TG1 and TG2.

According to example embodiments, the first and second tie gate contacts CB21 and CB22 penetrate the interlayer insulating films 31 and 32 and the etch stop film ESL to be connected to the first and second tie gate electrodes TG1 and TG2. In example embodiments, the first tie gate contact CB21 may contact the first tie gate electrode TG1, and the second tie gate contact CB22 may contact the second tie gate electrode TG2. The first tie gate contact CB21 and the second tie gate contact CB22 may be connected to the wiring pattern P1 of the wiring layer M1.

Interlayer insulating films 31, 32, and 33 may be disposed on the channel layer 12. The interlayer insulating films 31, 32, and 33 may include a low-k material. The interlayer insulating films 31, 32, and 33 may include, for example, silicon oxide. The interlayer insulating films 31 may cover the first to fourth active gate electrodes AG1, AG2, AG3, and AG4, the first and second tie gate electrodes TG1 and TG2, and the source/drain regions SD11 to SD17. The interlayer insulating film 32 may cover side surfaces of the first and second gate contacts CB21 and CB22. The interlayer insulating film 33 may cover side surfaces of the wiring patterns P1.

Referring to FIGS. 1 and 2B, the etch stop film ESL may expose upper surfaces of the source/drain regions SD11, SD13, SD15, and SD17. The first and second source/drain contacts CA11 and CA12 may penetrate the interlayer insulating films 31 and 32 and the etch stop film ESL to be connected to the source/drain regions SD11 to SD17. At least one of the first and second source/drain contacts CA11 and CA12 may include a lower source/drain contact penetrating the interlayer insulating film 31 and an upper source/drain contact penetrating the interlayer insulating film 32.

The first and second source/drain contacts CA11 and CA12 may be connected to the wiring patterns P1 and P21 of the first wiring layer M1. According to example embodiments, the first and second source/drain contacts CA11 and CA12 may be connected to the wiring patterns of the first wiring layer M1 to which the positive supply voltage VDD is applied or the wiring patterns of the first wiring layer M1 to which the negative supply voltage VSS is applied.

As a non-limiting example, a positive supply voltage VDD may be applied to the source/drain regions SD11, SD13, SD15, and SD17, and a negative supply voltage VSS may be applied to the source/drain regions SD12, SD14, and SD16.

Referring to FIGS. 1 to 2B, the first tie gate electrode TG1 may be configured to be electrically connected to the source/drain region SD13 through the first tie gate contact CB21, the wiring pattern P1, and the second source/drain contact CA12. The second tie gate electrode TG2 may be configured to be electrically connected to the source/drain region SD15 through the second tie gate contact CB22, the wiring pattern P1, and the first source/drain contacts CA11.

In example embodiments, the first tie gate contact CB21 may be formed through a separate process from the second source/drain contact CA12, and the second tie gate contact CB22 may be formed through a separate process from the first source/drain contact CA11.

In example embodiments, the first tie gate contact CB21 may be formed through the same process as that of the first source/drain contact CA11, and the second tie gate contact CB22 may be formed by the same process as that of the second source/drain contact CA12.

For example, the first tie gate contact CB21 and the first source/drain contact CA11 may be formed by a first lithography process based on a first photomask and a first etching process based on the first lithography process, and the second tie gate contact CB22 and the second source/drain contact CA12 may be formed by a second lithography process based on a second photomask different from the first photomask and a second etching process based on the second lithography process.

According to example embodiments, by forming the first source/drain contact CA11 and the first tie gate contact CB21 through a separate lithography process and an etching process from the second source/drain contact CA12 and the second tie gate contact CB22, a distance between the first tie gate contact CB21 and the second source/drain contact CA12 and a distance between the second tie gate contact CB22 and the first source/drain contact CA11 may be reduced. Accordingly, the height of the cell (i.e., the Y-direction length of the portion shown in FIG. 1) may be reduced, and the degree of integration of the integrated device 100 may be improved.

According to example embodiments, the distance CD1 between the first tie gate contact CB21 and the second source/drain contact CA12 connected to the wiring pattern P1 may be in a range of about 40 nm to about 70 nm. According to example embodiments, the distance CD2 between the second tie gate contact CB22 connected to the wiring pattern P1 and the first source/drain contact CA11 may be in a range of about 40 nm to about 70 nm.

According to example embodiments, by forming the first source/drain contact CA11 and the first tie gate contact CB21 through a separate lithography process and an etching process from the second source/drain contact CA12 and the second tie gate contact CB22, the distance CD1 and the distance CD2 may be greatly reduced compared to the gate pitch CPP. The distance CD1 and the distance CD2 may be, for example, in the range of about 0.35 times to about 0.7 times the gate pitch CPP.

Here, the gate pitch CPP is a unit in which the first to fourth active gate electrodes AG1, AG2, AG3, AG4 and the first and second tie gate contacts DG1 and DG2 are repeated and may be defined as a distance in the X direction between the center of the first active gate electrode AG1 in the X direction and the center of the first tie gate electrode DG1 in the first direction.

The above-described distances CD1 and CD2 and the gate pitch CPP may be measured by, for example, a scanning electron microscope (SEM) under standard temperature and pressure. The ratio of the distances CD1 and CD2 and the gate pitch CPP may be derived by an operation based on the measured values.

Also, the integrated circuit 100 does not include a bar-shaped contact directly connected to each of the first tie gate electrode TG1 and the source/drain region SD13. Accordingly, it is possible to prevent the bar-shaped contact from being short-circuited with the underlying channel layer 12 or the substrate 10 made of bulk silicon due to damage to the active gate spacer AGS and the tie gate spacer TGS in the etching process for forming the bar-shaped contact. Accordingly, the manufacturing yield of the integrated circuit 100 may be improved.

According to example embodiments, the first and second tie gate contacts CB21 and CB22 may be on the first active region RX1. According to example embodiments, the first and second tie gate contacts CB21 and CB22 may overlap the first active region RX1 vertically (in the Z direction). In example embodiments, the first and second tie gate contacts CB21 and CB22 may be horizontally spaced apart from the field region FR. In example embodiments, the first and second tie gate contacts CB21 and CB22 may not vertically (in the Z direction) overlap the field region FR. According to example embodiments, by providing the first and second tie gate contacts CB21 and CB22 on the first active region RX1, it is possible to maximize the area of the first active region RX in the cell of the same height. Accordingly, the operating performance of the integrated circuit 100 may be improved.

In example embodiments, the width W2 of the first and second tie gate contacts CB21 and CB22 may be different from the width W1 of each of the first to fourth active gate electrodes AG1, AG2, AG3, and AG4. In example embodiments, the width W2 of the first and second tie gate contacts CB21 and CB22 may be greater than the width W1 of each of the first to fourth active gate electrodes AG1, AG2, AG3, and AG4. In example embodiments, the width W2 of the first and second tie gate contacts CB21 and CB22 may be in a range of about 105% to about 120% of the width W1 of each of the first to fourth active gate electrodes AG1, AG2, AG3, and AG4. In example embodiments, the width W2 of the first and second tie gate contacts CB21 and CB22 may be about 110% of the width W1 of each of the first to fourth active gate electrodes AG1, AG2, AG3, and AG4. Accordingly, according to example embodiments, even when the first and second tie gate contacts CB21 and CB22 are on the first active region RX1, defects in the integrated circuit 100 due to misalignment of the first and second tie gate contacts CB21 and CB22 may be prevented.

Referring to FIGS. 1 and 2C, shallow trench insulating films 25 may be disposed on the substrate 10. The shallow trench insulating films 25 may separate the second active regions RX2 so that the adjacent second active regions RX2 are spaced apart in the X direction.

According to example embodiments, the shallow trench insulating films 25 may include an insulating material. As a non-limiting example, the shallow trench insulating films 25 may include any one of $SiO_2$, SiN, SiON, and SiOCN.

The buried oxide layer 11 and the channel layer 13 may be spaced apart from each other in the row direction (e.g., in the X direction) with the shallow trench insulating films 25 arranged therebetween. The interlayer insulating films 31, 32, and 33 may further cover the upper surface of the shallow trench insulating films 25.

The channel layer 13 may include, for example, a semiconductor material. According to example embodiments, the channel layer 13 may be a Si layer provided by an epitaxial growth process or the like.

According to example embodiments, the channel layer 13 may be doped to have a conductivity type different from that of the source/drain regions SD21 to SD27. For example, when the source/drain regions SD21 to SD27 are doped with N-type dopants, the channel layer 13 may be doped with P-type dopants.

According to example embodiments, first to fourth active gate electrodes AG1, AG2, AG3, and AG4, and source/drain regions SD21, SD22, SD23, SD24, SD25, SD26, and SD27 (hereinafter SD21 to SD27) may be disposed on the channel layer 13 of the second active region RX2. According to example embodiments, the first and second tie gate electrodes TG1 and TG2 may be disposed on the shallow trench insulating films 25 of the second active region RX2. The first to fourth active gate electrodes AG1, AG2, AG3, and AG4 may extend from the first active region RX1 to the second active regions RX2, and the first and second tie gate electrodes TG1 and TG2 may extend from the first active region RX onto the shallow trench insulating film 25 arranged between the second active regions RX2.

According to example embodiments, the etch stop film ESL may cover the first to fourth active gate electrodes AG1, AG2, AG3, and AG4, the first and second tie gate electrodes TG1 and TG2, and the source/drain regions SD21 to SD27 disposed on the channel layer 13. In example embodiments, the etch stop film ESL may expose the upper surfaces of the source/drain regions SD21, SD23, and SD26.

The source/drain regions SD21 to SD27 may be provided by, for example, in-situ doped RSD epitaxial growth. According to example embodiments, the upper surfaces of the source/drain regions SD21 to SD27 may be at a higher level than the upper surfaces of the channel layer 12. Accordingly, a short channel effect may be prevented, and contacts to the source/drain regions SD11 to SD17 may be easily provided.

According to example embodiments, the first and second source/drain contacts CA21 and CA22 penetrate the interlayer insulating films 31 and 32 and the etch stop film ESL to be connected to the source/drain regions SD21 to SD27. At least one of the first and second source/drain contacts CA21 and CA22 may include a lower source/drain contact penetrating the interlayer insulating film 31 and an upper source/drain contact penetrating the interlayer insulating film 32.

The first and second source/drain contacts CA21 and CA22 may be connected to the wiring patterns P41, P42, and P5 of the first wiring layer M1. According to example embodiments, the first and second source/drain contacts CA21 and CA22 may be connected to the wiring patterns of the first wiring layer M1 to which the positive supply voltage VDD is applied or the wiring patterns of the first wiring layer M1 to which the negative supply voltage VSS is applied.

As a non-limiting example, a negative supply voltage VSS may be applied to the source/drain regions SD21, SD23, SD25, and SD27, and a positive supply voltage VDD may be applied to the drain regions SD22, SD24, and SD26.

The source/drain regions SD21 and SD22 and the first active gate electrode AG1 may constitute a first N-type MOSFET. The source/drain regions SD23 and SD24 and the second active gate electrode AG2 may constitute a second N-type MOSFET. The source/drain regions SD24 and SD25 and the third active gate electrode AG3 may constitute a third N-type MOSFET. The source/drain regions SD26 and SD27 and the fourth active gate electrode AG4 may constitute a fourth N-type MOSFET.

According to example embodiments, since the second active regions RX2 are separated by the shallow trench insulating film 25, the first N-type MOSFET may be physically isolated from the second N-type MOSFET. Similarly, since the second active regions RX2 are separated by the shallow trench insulating film 25, the third N-type MOSFET may be physically isolated from the fourth N-tune MOSFET.

Referring to FIGS. 1 and 2D, the deep trench insulating film 20 may horizontally surround the first active region RX1 and the second active regions RX2. The deep trench insulating film 20 may include a portion arranged between the first active region RX1 and the second active regions RX2. The first active region RX1 and the second active regions RX2 may be separated from each other by the deep trench insulating film 20.

According to example embodiments, the deep trench insulating films 20 may include an insulating material. As a non-limiting example, the deep trench insulating films 20 may include any one of $SiO_2$, SiN, SiON, and SiOCN.

In example embodiments, the second active gate contact CB12 may penetrate the interlayer insulating films 31 and 32 and the etch stop film ESL to be connected to the third active gate electrode AG3. In example embodiments, the second active gate contact CB12 may contact the third active gate electrode AG3. The second active gate contact CB12 may be connected to the wiring pattern P31 of the wiring layer M1. The second active gate contact CB12 and the wiring pattern P31 of the wiring layer M1 may vertically (in the Z direction) overlap the deep trench insulating film 20.

Referring to FIGS. 1 and 2E, the first active gate contact CB11 may penetrate the interlayer insulating films 31 and 32 and the etch stop film ESL to be connected to the fourth active gate electrode AG4. In example embodiments, the first active gate contact CB11 may contact the fourth active gate electrode AG4. The first active gate contact CB11 may be connected to the wiring pattern P32 of the wiring layer M1. The first active gate contact CB11 and the wiring pattern P32 of the wiring layer M1 may vertically (in the Z direction) overlap the deep trench insulating film 20.

As a non-limiting example, a negative supply voltage VSS may be applied to the wiring pattern P33 of the wiring layer M1. The wiring pattern P33 of the wiring layer M1 may be connected to the source region S14 and the source region S25, and may provide a negative supply voltage VSS to the source region S14 and the source region S25.

Referring to FIGS. 1 and 2F, the second tie gate electrode TG2 may vertically (in the Z direction) overlap the shallow trench insulating film 25. The second tie gate electrode TG2 may not vertically overlap the channel layer 13 (refer to FIG. 2E) of the second active region RX2.

Figure 3:
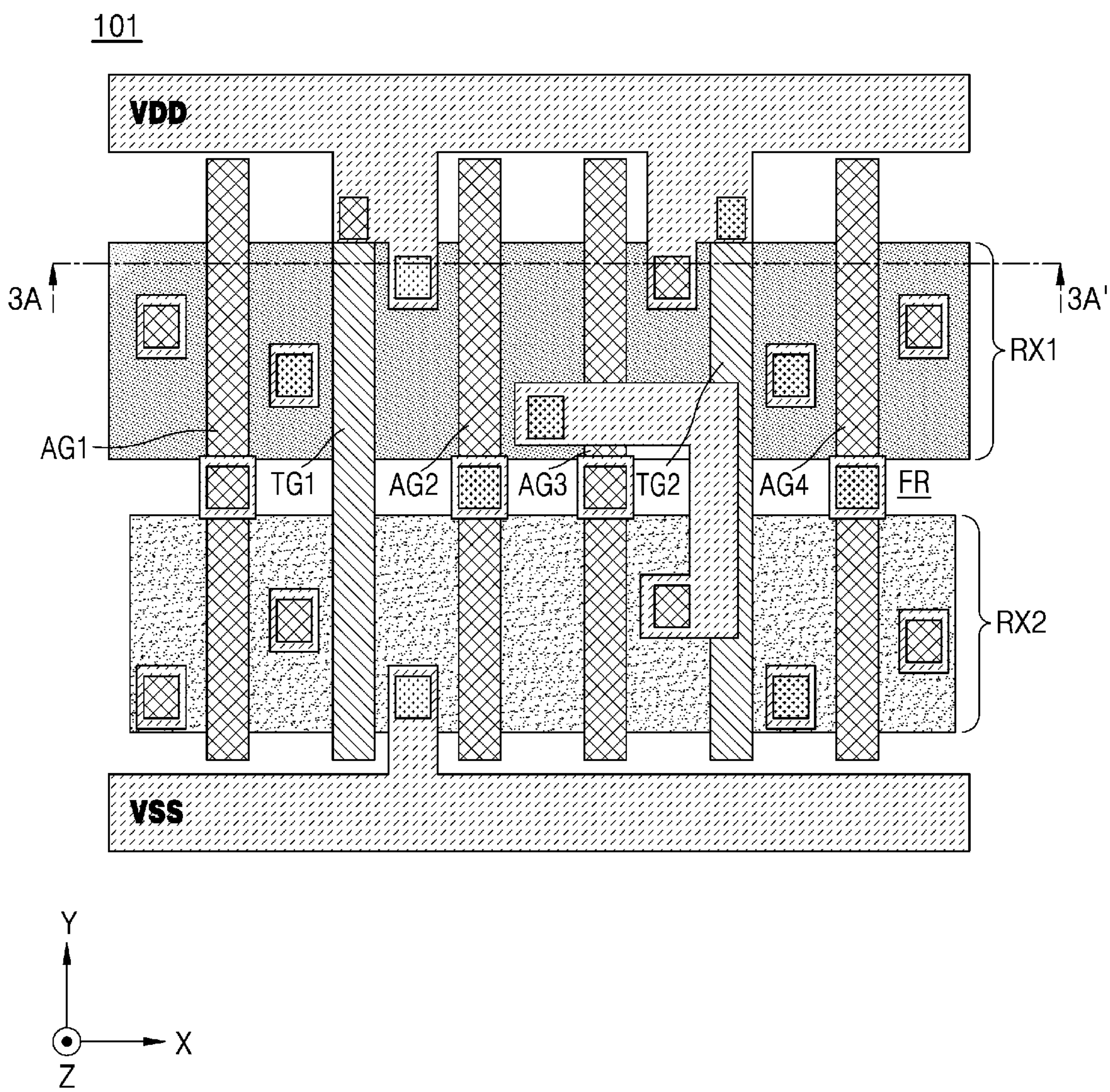
FIG. 3 is a diagram illustrating an integrated circuit according to example embodiments.

FIG. 3 is a diagram illustrating an integrated circuit 101 according to example embodiments.

Figure 4:
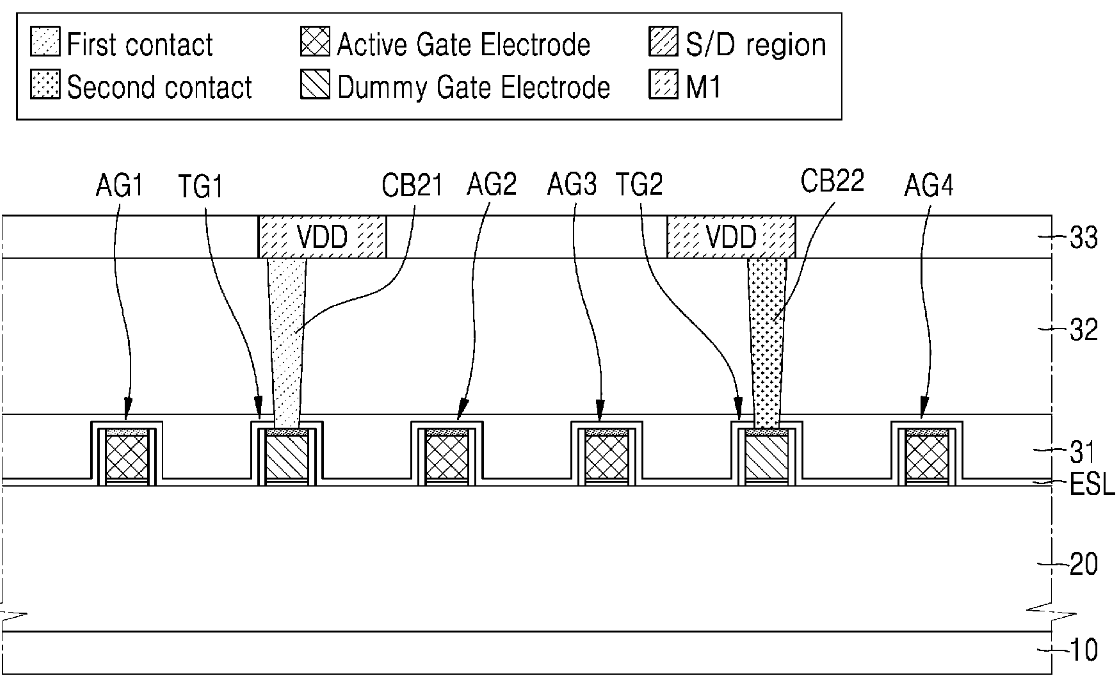
FIG. 4 is a cross-sectional view taken along the cut line 3A-3A' of 3 according to example embodiments.

FIG. 4 is a cross-sectional view taken along the cut line 3A-3A' of 3.

For convenience of explanation, the overlapping with those described with reference to FIGS. 1 to 2F will be omitted, and differences will be mainly described.

Referring to FIGS. 3 and 4, the first and second tie gate contacts CB21 and CB22 may contact the first and second tie gate electrodes TG1 and TG2 in the field region FR. According to example embodiments, the first and second tie gate contacts CB21 and CB22 may vertically (in the Z direction) overlap the deep trench insulating film 20.

In example embodiments, since the first and second tie gate contacts CB21 and CB22 are disposed on the field region FR, the first and second tie gate contacts CB21 and CB22 and the channel layer (refer to FIG. 2A) may not be shorted. In example embodiments, the X-direction width of each of the first and second tie gate electrodes TG1 and TG2 may be substantially equal to the X direction width of each of the first to fourth active gate electrodes AG1, AG2, AG3, and AG4.

Figure 5:
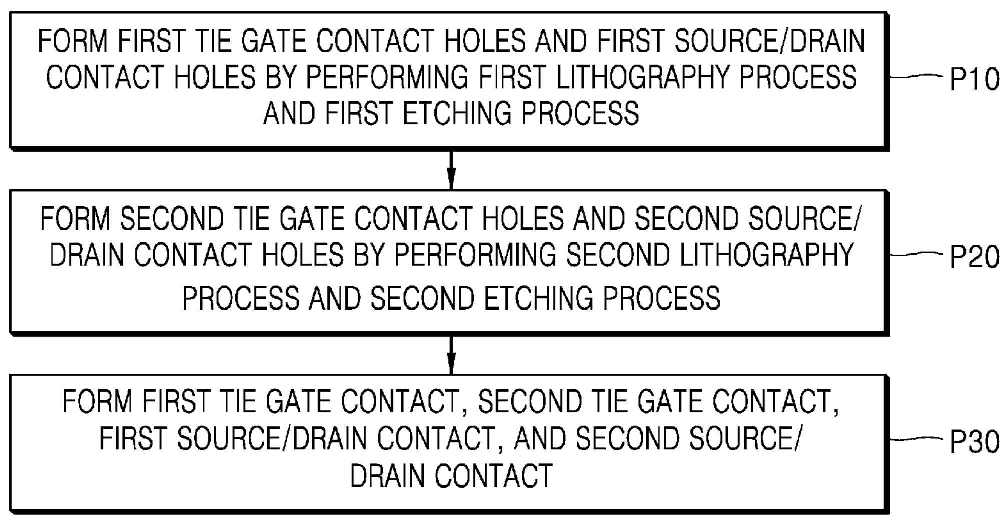
FIG. 5 is a flowchart illustrating a method for manufacturing an integrated circuit according to example embodiments.

FIG. 5 is a flowchart illustrating a method for manufacturing the integrated circuit 100 according to example embodiments.

Figure 6A:
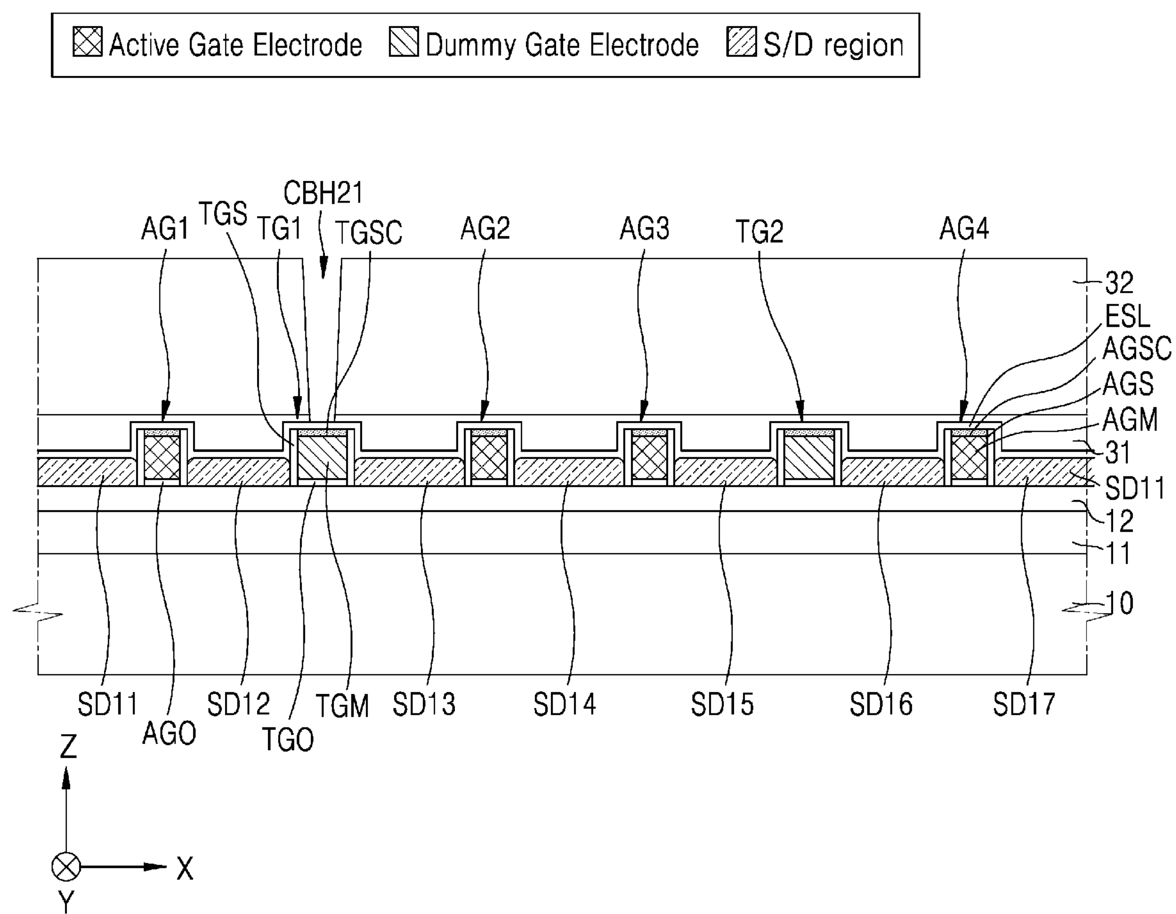
FIGS. 6A, 6B, 7A, 7B, 8A and 8B are cross-sectional views illustrating a method for manufacturing an integrated circuit according to example embodiments.

Referring to FIGS. 6A to 8B are cross-sectional views for explaining a method for manufacturing the integrated circuit 100 according to example embodiments. More specifically, FIGS. 6A, 7A, and 8A show parts corresponding to FIG. 2A, and FIGS. 6B, 7B, and 8B show parts corresponding to FIG. 2B.

Figure 6B:
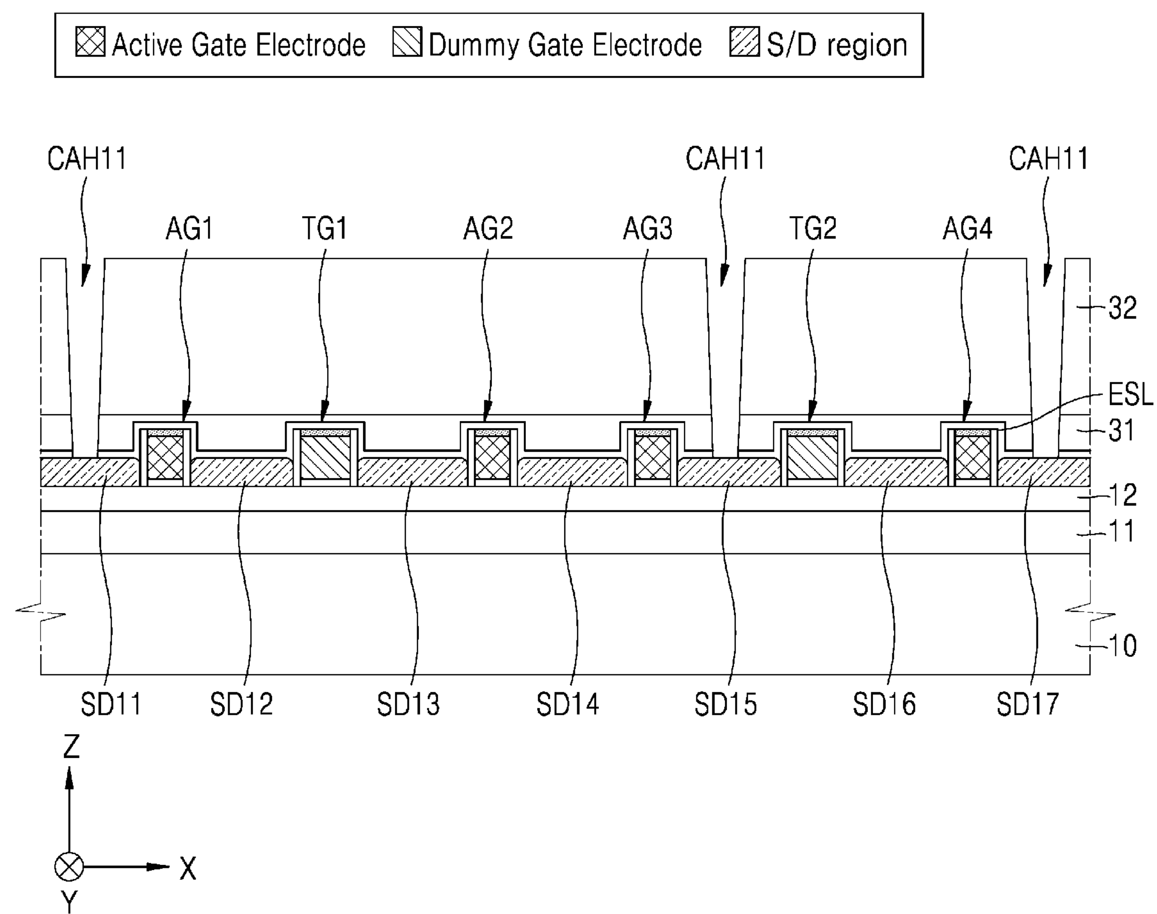

Referring to FIGS. 5, 6A and 6B, in operation P10, first tie gate contact holes CBH21 and first source/drain contact holes CAH11 may be formed by performing a first lithography process and a first etching process.

In example embodiments, a front-end-of-line (FEOL) process may be performed before the first lithography process and the first etching process are performed. The FEOL process may include planarizing and cleaning the substrate 10, forming a trench, forming a well, forming a buried oxide layer 11, forming first to fourth active gate electrodes AG1, AG2, AG3, and AG4 and first and second tie gate electrodes DG1 and DG2, and forming the source/drain regions SD11 to SD17. With FEOL, individual elements such as transistors, capacitors, resistors, and the like may be formed on a substrate. Subsequently, an etch stop film ESL and interlayer insulating films 31 and 32 may be formed.

After providing the first hardmask layer and the first photoresist layer on the etch stop film ESL and the interlayer insulating films 31 and 32, the first photoresist layer may be patterned by a first lithography process. The first lithography process may include exposing the first photoresist layer using, for example, extreme ultra violet (EUV) laser (13.5 nm), or a deep ultraviolet (DUV) laser such as a KrF (248 nm) laser and an ArF (193 nm) laser, and developing and removing the exposed (or unexposed) portion of the first photoresist layer. Then, after patterning the first hard mask using the first photoresist layer as an etch mask, by etching the interlayer insulating films 31 and 32 using the patterned first hard mask as an etch mask, first tie gate contact holes CBH21 and first source/drain contact holes CAH11 may be formed. After the etching process is performed, the first photoresist layer and the first hard mask layer may be removed.

Figure 7A:
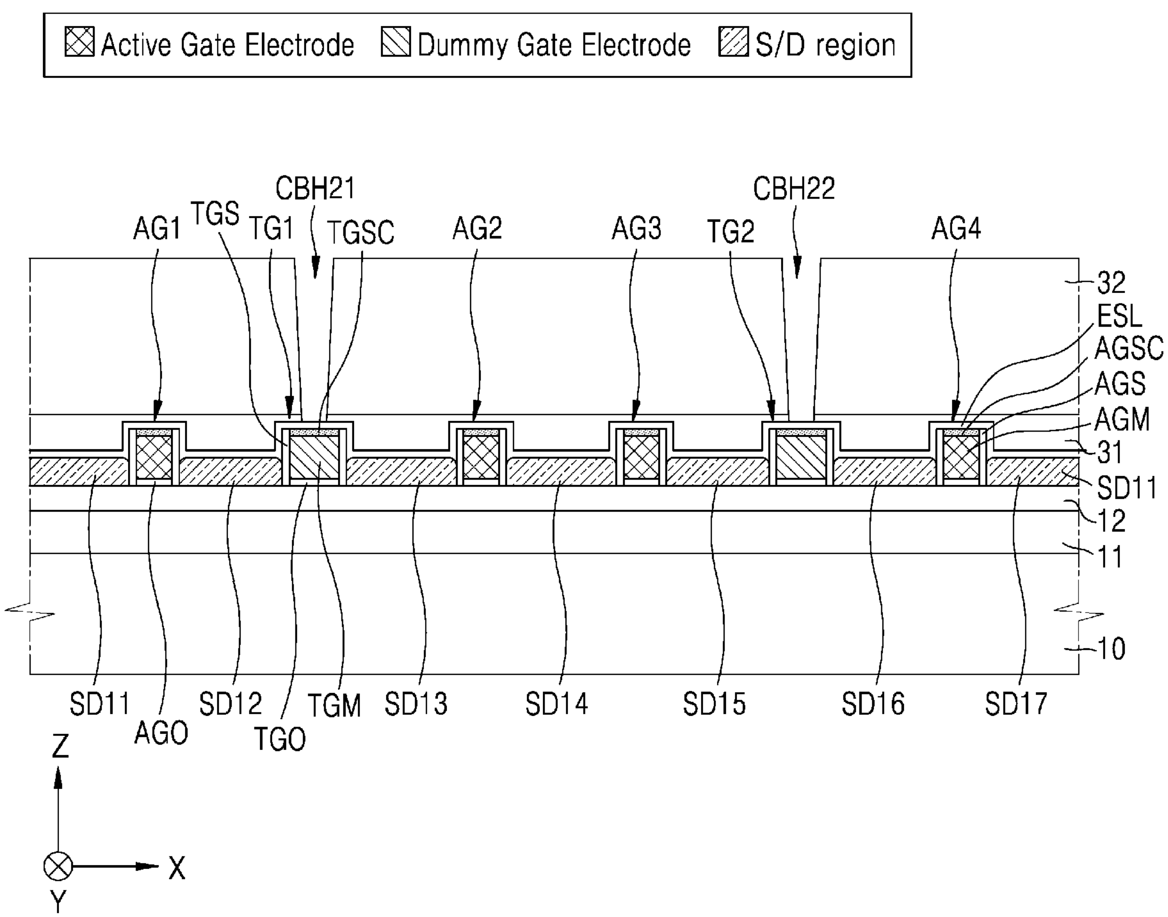
Figure 7B:
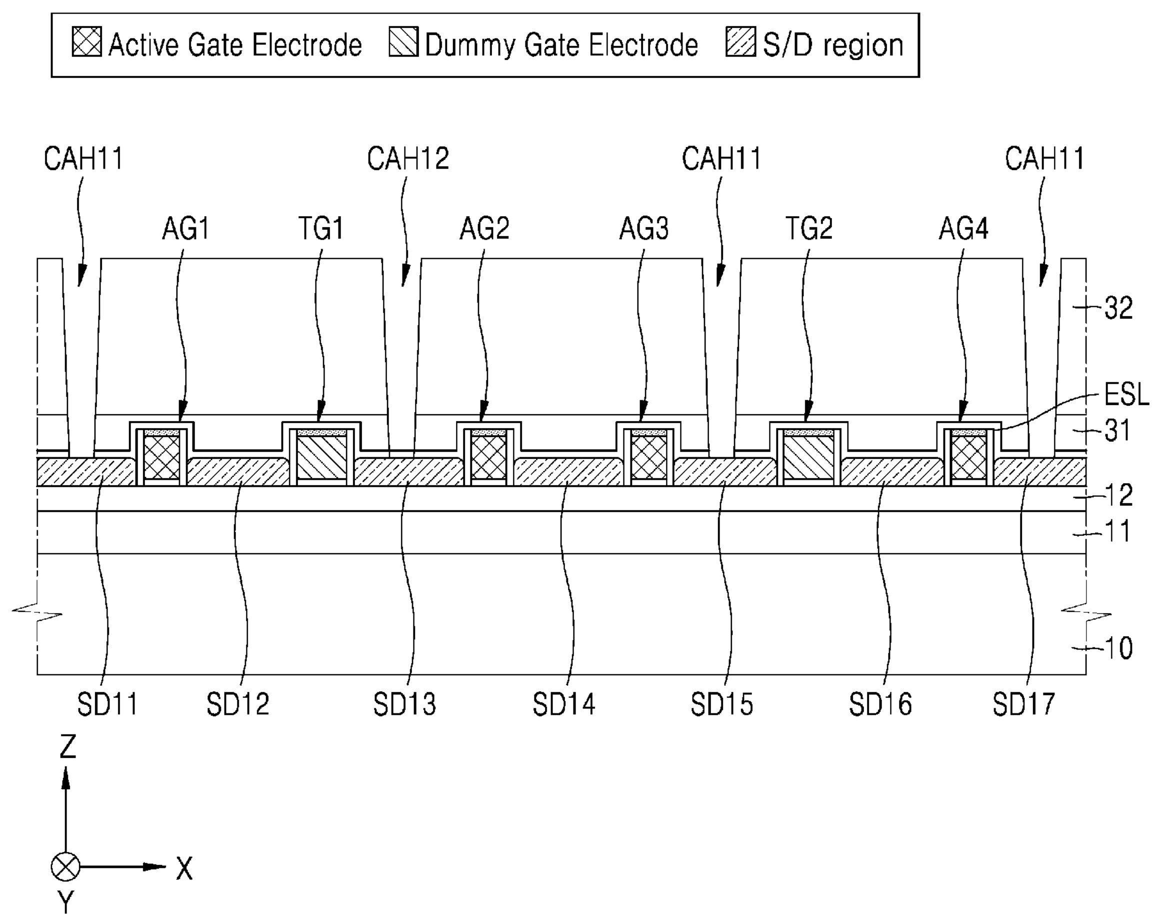

Referring to FIGS. 5, 7A and 7B, in operation P20, second tie gate contact holes CBH22 and second source/drain contact holes CAH12 may be formed by performing a second lithography process and a second etching process.

After providing the second hardmask layer and the second photoresist layer on the etch stop film ESL and the interlayer insulating films 31 and 32, the second photoresist layer may be patterned by a second lithography process. The second lithography process may be substantially the same as the first lithography process, except for the exposed positions. Subsequently, after patterning a second hard mask using the second photoresist layer as an etch mask, by etching the interlayer insulating films 31 and 32 using the patterned second hard mask as an etch mask, second tie gate contact holes CBH22 and second source/drain contact holes CAH12 may be formed. After the etching process is performed, the second photoresist layer and the second hard mask layer may be removed.

Figure 8A:
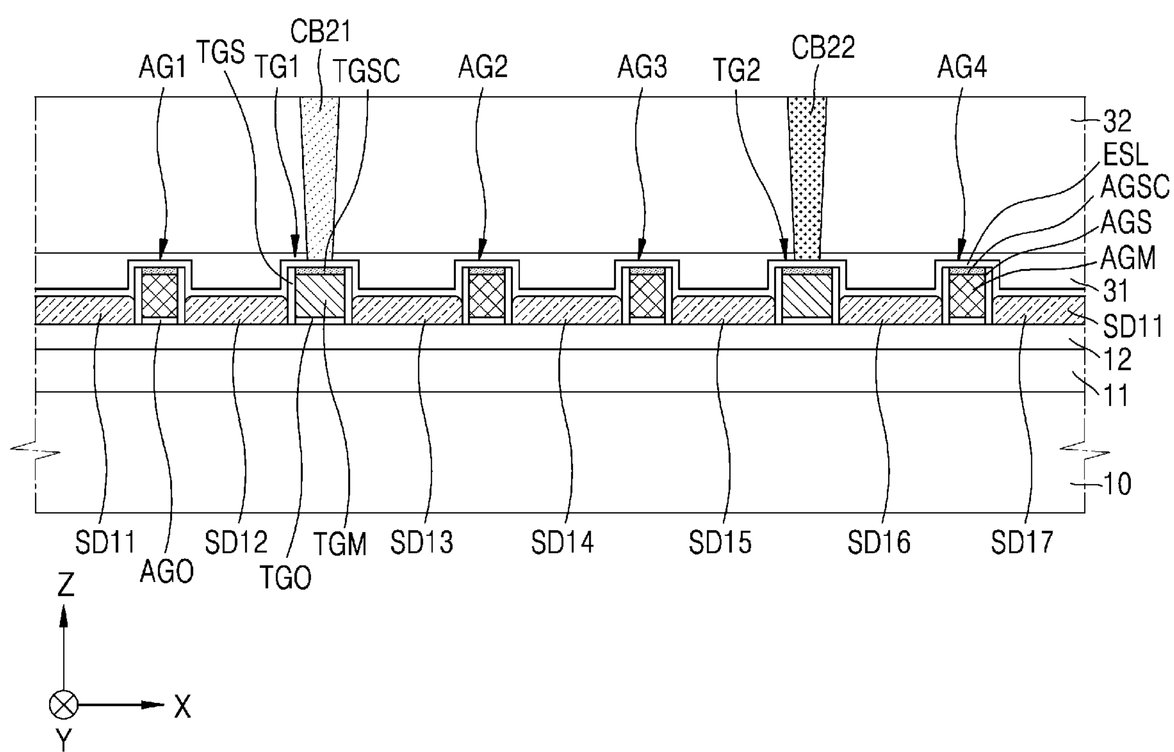
Figure 8B:
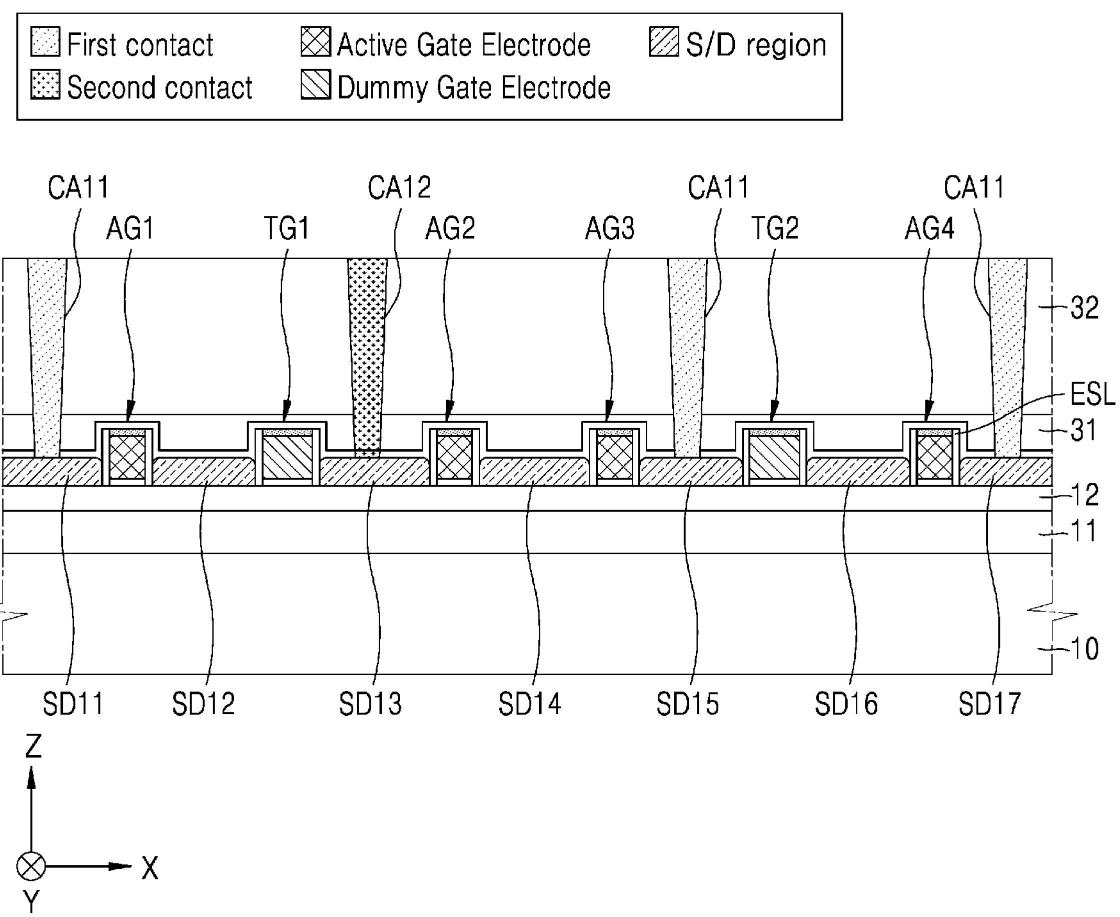

Next, referring to FIGS. 5, 8A and 8B, in operation P30, a first tie gate contact CB21, a second tie gate contact CB22, a first source/drain contact CA11, and a second source/drain contact CA12 may be formed.

By removing the portions of the etch stop film ESL exposed by the first tie gate contact holes CBH21 (refer to FIG. 7A), the first source/drain contact holes CAH11 (refer to FIG. 7B), the second tie gate contact holes CBH22 (refer to FIG. 7A), and the second source/drain contact holes CAH12 (refer to FIG. 7B), upper surfaces of the first and second tie gate electrodes TG1 and TG2 and the source/drain regions SD11, SD13, SD15, and SD17 may be exposed. Then, after providing the conductive material, by performing a node separation process such as metal Chemical Mechanical Polishing (CMP) or wet etching, a first tie gate contact CB21, a second tie gate contact CB22, a first source/drain contact CA11, and a second source/drain contact CA12 may be formed.

According to various example embodiments, to implement a tie-down gate, separate contacts formed on the gate electrode and the source/drain region may be shorted by a wiring layer. The separate contact may be formed by a separate lithography process and a separate etching process, and therefore the distance between the contacts is reduced, further reducing cell height. Furthermore, by locating the dummy gate contact over the active gate electrode, an area of the active region is increased. A width of the dummy gate may be greater than a width of the active gate.

While the disclosure has been particularly shown and described with reference to embodiments thereof, it will be understood that various changes in form and details may be made therein without departing from the spirit and scope of the following claims.

What is claimed is:

1. An integrated circuit comprising:

a first active region extending in a first direction;

a second active region provided along the first direction;

a first active gate electrode, a second active gate electrode, a third active gate electrode and a fourth active gate electrode each extending in a second direction intersecting the first direction on the first active region and the second active regions, wherein the first active gate electrode, the second active gate electrode, the third active gate electrode and the fourth active gate electrode are spaced apart from each other in the first direction;

a first tie gate electrode provided between the first active gate electrode and the second active gate electrode and extending in the second direction;

a second tie gate electrode provided between the third active gate electrode and the fourth active gate electrode and extending in the second direction;

a first source/drain region on the first active region, wherein the first source/drain region is provided between the first tie gate electrode and the second active gate electrode;

a second source/drain region on the first active region, wherein the second source/drain region is provided between the third active gate electrode and the second tie gate electrode;

a first tie gate contact extending in a third direction perpendicular to the first direction and the second direction and connected to the first tie gate electrode;

a second tie gate contact extending in the third direction and connected to the second tie gate electrode;

a first source/drain contact extending in the third direction and connected to the second source/drain region; and a second source/drain contact extending in the third direction and connected to the first source/drain region, wherein the first tie gate contact is configured to be shorted to the second source/drain contact, and wherein the second tie gate contact is configured to be shorted to the first source/drain contact.

2. The integrated circuit of claim 1, wherein a distance between the first tie gate contact and the second source/drain contact is about 40 nm to about 70 nm, and wherein a distance between the second tie gate contact and the first source/drain contact is about 40 nm to about 70 nm.

3. The integrated circuit of claim 1, further comprising a wiring pattern configured to be electrically connected to the first tie gate contact, the second tie gate contact, the first source/drain contact, and the second source/drain contact, and configured to apply a positive supply voltage.

4. The integrated circuit of claim 1, wherein a width of the first tie gate electrode in the first direction is different from a width of the first active gate electrode in the first direction.

5. The integrated circuit of claim 1, wherein a width of the first tie gate electrode in the first direction is greater than a width of the first active gate electrode in the first direction.

6. The integrated circuit of claim 1, wherein a width of the first tie gate electrode in the first direction is about 105% to about 120% of a width of the first active gate electrode in the first direction.

7. The integrated circuit of claim 1, wherein the first tie gate contact and the second tie gate contact overlap the first active region in the third direction.

8. The integrated circuit of claim 1, wherein the first tie gate contact and the second tie gate contact are spaced apart from the first active region in the second direction.

9. The integrated circuit of claim 1, wherein the first tie gate contact is formed by a first process separate from the second source/drain contact, and wherein the second tie gate contact is formed through a second process separate from the first source/drain contact.

10. The integrated circuit of claim 1, wherein the first tie gate contact is formed through the same process as that of the first source/drain contact, and wherein the second tie gate contact is formed through the same process as that of the second source/drain contact.

11. An integrated circuit comprising:

a continuous active region extending in a first direction;

a tie gate electrode extending in a second direction crossing the first direction on the continuous active region;

a source/drain region provided adjacent the tie gate electrode;

a tie gate contact extending in a third direction perpendicular to the first direction and the second direction on the continuous active region and connected to the tie gate electrode;

a source/drain contact extending in the third direction and connected to the source/drain region; and a wiring pattern connected to each of the tie gate contact and the source/drain contact and extending in a horizontal direction, wherein a positive supply power is applied to the wiring pattern, wherein the tie gate contact is not overlapping to the source/drain region in the third direction, and wherein the source/drain contact is not overlapping to the tie gate electrode in the third direction.

12. The integrated circuit of claim 11, wherein the wiring pattern overlaps the continuous active region in the third direction.

13. The integrated circuit of claim 11, further comprising an active gate electrode extending in the second direction on the continuous active region and spaced apart from the tie gate electrode in the first direction with the source/drain region arranged therebetween, and wherein a width of the tie gate electrode in the first direction is greater than a width of the active gate electrode the first direction.

14. The integrated circuit of claim 13, wherein the width of the tie gate electrode in the first direction is about 105% to about 120% of the width of the active gate electrode in the first direction.

15. The integrated circuit of claim 13, further comprising an active gate contact extending in the third direction and connected to the active gate electrode, and wherein the active gate contact is spaced apart from the continuous active region in the second direction.

16. An integrated circuit comprising:

an active region extending in a first direction;

a first active gate electrode extending in a second direction crossing the first direction on the active region;

a second active gate electrode extending in the second direction on the active region and spaced apart from the first active gate electrode in the first direction;

a tie gate electrode provided between the first active gate electrode and the second active gate electrode and extending in the second direction;

a source/drain region provided between the tie gate electrode and the second active gate electrode;

a tie gate contact extending in a third direction perpendicular to the first direction and the second direction on the active region and connected to the tie gate electrode; and a source/drain contact extending in the third direction and connected to the source/drain region, wherein the tie gate contact is configured to be shorted to the source/drain contact, and wherein a distance between the tie gate contact and the source/drain contact is about 0.35times to about 0.7 times a gate pitch that is an arrangement interval in the first direction between the first active gate electrode and the second active gate electrode, and the tie gate electrode.

17. The integrated circuit of claim 16, wherein the gate pitch is about 100nm to about 110 nm.

18. The integrated circuit of claim 16, wherein a distance between the tie gate contact and the source/drain contact is about 40 nm to about 70 nm.

19. The integrated circuit of claim 16, wherein a width of the tie gate electrode in the first direction is about 105% to about 120% of a width of the first active gate electrode in the first direction.

20. The integrated circuit of claim 16, further comprising an active gate contact extending in the third direction, wherein the active gate contact is spaced apart from the active region in the second direction, and wherein the tie gate contact overlaps the active region in the third direction.

* * * * *